(12) United States Patent
Uchida et al.

(10) Patent No.: US 7,236,373 B2
(45) Date of Patent: Jun. 26, 2007

(54) ELECTRONIC DEVICE CAPABLE OF PREVENTING ELECTROMAGNETIC WAVE FROM BEING RADIATED

(75) Inventors: Kenji Uchida, Kawasaki (JP); Koki Hirasawa, Kawasaki (JP); Tatsuya Ohtaka, Tokyo (JP); Kazuhisa Kishino, Tokyo (JP); Sachio Suzuki, Tokyo (JP)

(73) Assignees: NEC Electronics Corporation, Kanagawa (JP); Hitachi Cable, Ltd., Tokyo (JP)

( * ) Notice: Subject to any disclaimer, the term of this patent is extended or adjusted under 35 U.S.C. 154(b) by 287 days.

(21) Appl. No.: 10/713,019

(22) Filed: Nov. 17, 2003

(65) Prior Publication Data

US 2004/0179344 A1 Sep. 16, 2004

(30) Foreign Application Priority Data

Nov. 18, 2002 (JP) ............................. 2002-333354

(51) Int. Cl.
*H05K 1/18* (2006.01)

(52) U.S. Cl. ..................... 361/763; 361/760; 361/792

(58) Field of Classification Search ........ 361/760–763, 361/792–795; 174/259, 262; 257/700–705
See application file for complete search history.

(56) References Cited

U.S. PATENT DOCUMENTS 4,814,943 A * 3/1989 Okuaki ....................... 361/783
4,881,116 A * 11/1989 Hidada et al. ............... 257/700
5,218,230 A * 6/1993 Tamamura et al. .......... 257/691
5,949,654 A * 9/1999 Fukuoka ...................... 361/760
6,197,614 B1 * 3/2001 Ho ............................. 438/108
6,495,914 B1 * 12/2002 Sekine et al. ................ 257/723

FOREIGN PATENT DOCUMENTS

JP           3171172 B2     3/2001
JP        2001-274278 A    10/2001

* cited by examiner

*Primary Examiner*—Tuan Dinh
(74) *Attorney, Agent, or Firm*—Sughrue Mion, PLLC

(57) ABSTRACT

A recess for fully receiving an electronic component and a window opened from the bottom of the recess to the bottom surface of a metal substrate are formed in the metal substrate. A wiring board is bonded to the underside of the metal substrate, and the electronic component is fixed to the bottom of the recess. Input and output terminals of the electronic component are connected to electrode pads of the wiring board exposed within the window using wire bonding. A metal lid is bonded to the top surface of the metal substrate to close the opening of the recess. Electromagnetic waves generated by the electronic component are confined to the electronic device because the electronic device is surrounded by the metal substrate, the metal lid, and a ground electrode disposed on the wiring board. Heat dissipation performance is assured because the electronic component is connected to the metal substrate.

10 Claims, 6 Drawing Sheets

ELECTRONIC DEVICE CAPABLE OF PREVENTING ELECTROMAGNETIC WAVE FROM BEING RADIATED

This application claims priority to prior application JP 2002-333354, the disclosure of which is incorporated herein by reference.

BACKGROUND OF THE INVENTION

The present invention relates to an electronic device capable of preventing electromagnetic waves from being radiated outside, in particular, to an electronic device having an electronic component placed in a recess formed in a metal substrate, and a method for manufacturing the electronic device.

Recently, the large scaled integrated circuit (LSI) is increasingly improved to obtain a higher integration degree and higher processing speed. With this improvement, a delay in a signal due to a package and a printed circuit board having the package thereon becomes significant when the LSI is packed in the package.

A multi-chip module (MCM) is available to cope with above-mentioned problem. In the MCM, a plurality of chips, such as LSIs, ICs, resistors, capacitors, etc., to be connected to each other are placed to each other as close as possible. The placement reduces the amount of delay due to the package and assures high-speed feature of the entire MCM.

The MCM is used in a variety of apparatuses including a cellular or mobile phone.

Some people are concerned about the effect of electromagnetic waves on the human body generated by a semiconductor device in an apparatus such as a cellular phone that is typically used in close vicinity of the human body. Such an apparatus employs a shield structure that prevents electromagnetic waves from being radiated from within the apparatus body to the outside. However, it is extremely difficult to completely block the electromagnetic waves even if the body of the apparatus employs the shield structure. In practice, the electromagnetic waves generated in the semiconductor device probably leak out of the apparatus.

On the other hand, within the apparatus, the electromagnetic waves emitted from the electronic component (chip) may cause another electronic component to malfunction. Accordingly, these electronic components must be spaced apart from each other, and a compact design is difficult to implement. In the cellular phone, power required for transmission is substantially larger than power required for reception. If electronic components in the cellular phone are located close to each other, a transmitter section may cause an electronic component in a receiver section to malfunction because of the large power for transmission. It is thus difficult to realize the transmitter section and the receiver section in an MCM in the cellular phone.

There is a need for an electromagnetic shield structure that shields the electronic components from the electromagnetic waves in the semiconductor device such as the MCM. Alternatively, there is a need for an electronic device that can prevents the electromagnetic waves form being radiated outside.

SUMMARY OF THE INVENTION

Accordingly, it is an object of the present invention to provide an electronic device that is capable of preventing electromagnetic waves from being radiated outside.

Other objects of the present invention will become clear as the description proceeds.

To achieve the above objects, the present invention provides an electronic device in which an electronic component is housed in a recess (or a hole) provided in a metal substrate, and is surrounded by the metal substrate (and a metal lid), and a wiring board.

According to a first aspect of the present invention, an electronic device comprises an electronic component. A metal substrate has a recess that is large enough to fully receive the electronic component. A wiring board has a surface area larger than the area of the opening of the recess and has a wiring pattern formed on the top surface thereof. At least a portion of the surface of the wiring board is fixed to one of the top surface and the bottom surface of the metal substrate. The electronic component is mechanically fixed to the bottom of the recess while being electrically connected to the wiring pattern.

The metal substrate may be a first metal substrate that has a window that is opened from the bottom of the recess through to the bottom surface of thereof. The wiring board may be fixed to the bottom surface of the metal substrate so that a portion of the wiring pattern is exposed in the recess through the window. The electronic component may be electrically connected to the wiring pattern exposed in the recess through the window using a bonding wire.

A metal lid may be fixed to close the opening of the recess.

The metal substrate may be a second metal substrate having no window. In such a case, the wiring board may be fixed to the top surface of the second metal substrate to close the opening of the recess, and the electronic component may be connected to the wiring pattern using flipchip bonding.

The second metal substrate may include a unitary substrate having a recess on the top surface thereof, or may be include a main substrate portion having a through hole that is opened from the top surface to the bottom surface, and a metal lid that closes the opening of the through hole on one side of the through hole to produce the recess from the through hole.

In the electronic device, the wiring board may be fixed to the metal substrate using one of diffusion bonding and fusion boding in which a surface treatment film made of gold, silver, tin, or a combination thereof is formed on each of surface area of the wiring pattern and a surface area of the metal substrate to be bonded together and the surface treatment film of the wiring pattern and the surface treatment film of the metal substrate are forced into contact under a predetermined condition.

In another aspect of the present invention, a method for manufacturing an electronic device includes a first step for fixing a wiring board on a metal substrate having a hole of a predetermined configuration in a manner such that the wiring board is partially exposed in the hole, a second step for electrically connecting the electronic component to the wiring board exposed in the hole with the electronic component placed in the hole, and a third step for fixing a metal lid to the metal substrate to close the opening of the hole.

The second step includes fixing the electronic component to the metal substrate on the bottom of the hole, and electrically connecting the electronic component to the wiring board through the window provided in the bottom of the hole using a bonding wire. Alternatively, the second step may include flipchip bonding, and the third step may include fixing mechanically the electronic component to the metal lid.

In yet another aspect of the present invention, a method for manufacturing an electronic device includes a first step for forming, in a metal substrate, a recess to receive an electronic component, a second step for electrically connecting the electronic component to a wiring board, and a third step for fixing the wiring board to the metal substrate in a manner such that the electronic component is received in the recess to close the opening of the recess, and for mechanically fixing the electronic component on the bottom of the recess.

The second step may include flipchip bonding.

DESCRIPTION OF THE PREFERRED EMBODIMENTS

Figure 1A:
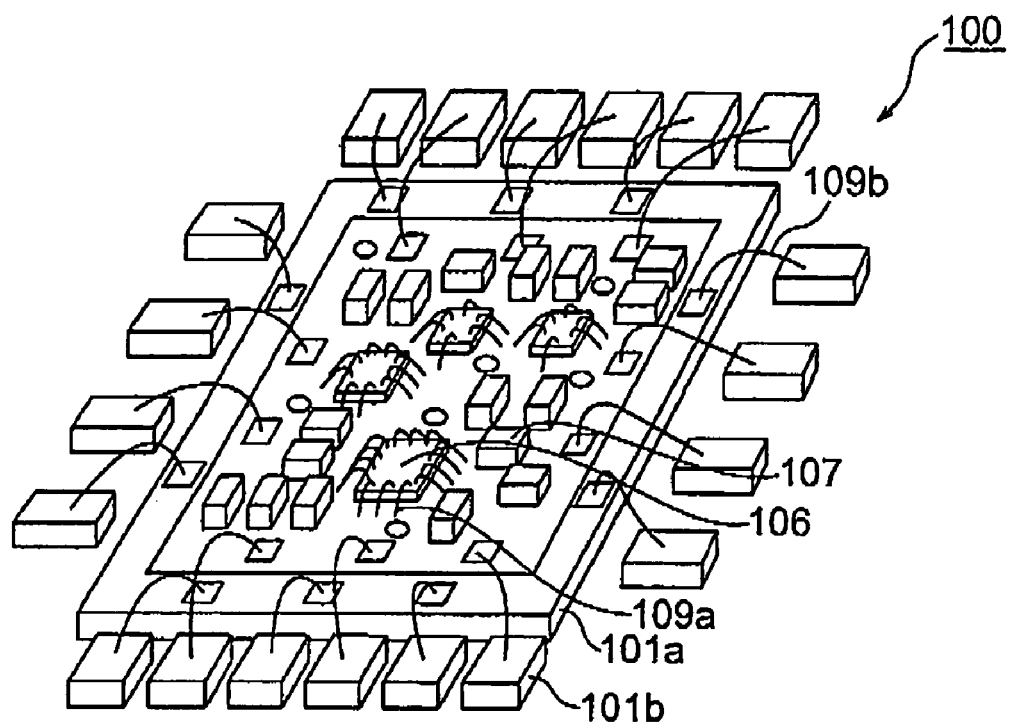
FIG. 1A is an oblique perspective view of a related MCM.
Figure 1B:
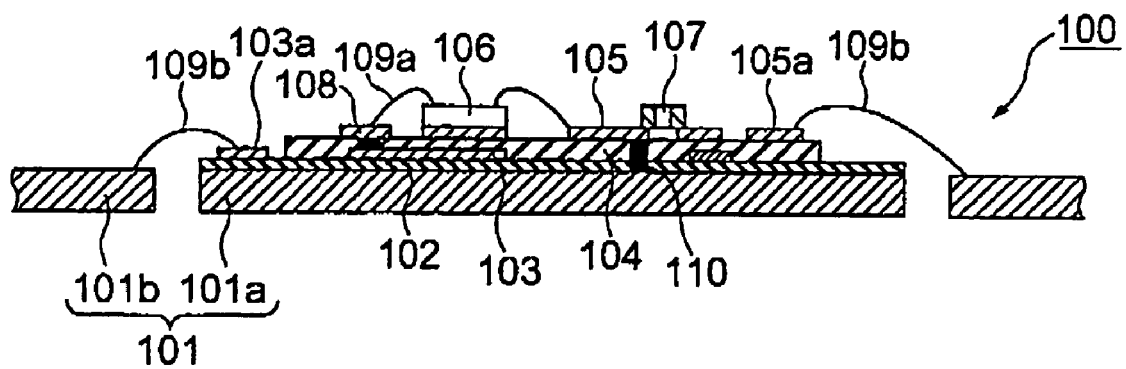
FIG. 1B is a longitudinal sectional view of the MCM of FIG. 1A.

Referring to FIGS. 1A and 1B, description will be at first directed to a related multi chip module (MCM).

FIG. 1A is an oblique perspective view of the related MCM 100. FIG. 1B is a longitudinal sectional view of the MCM 100 of FIG. 1A.

As shown in FIGS. 1A and 1B, the MCM includes a lead frame 101 made of a sheet metal, a lower insulator 102 disposed on an island 101a of the lead frame 101, a first wiring layer 103, an interlayer insulator 104, a second wiring layer 105, and a plurality of electronic components, such as an IC chip 106, a single chip 107 and so on, mounted on the second wiring layer 105.

The first wiring layer 103 and the second wiring layer 105 are patterned to desired configurations to form wiring patterns. Each wiring pattern comprises a plurality of patterned wires and electrode pads. A part of patterned wires of the first wiring layer 103 may be connected to a part of the patterned wires of the second wiring layer 105 through contacts 108 (only one shown) at predetermined locations. Each contact 108 is provided in a contact hole penetrating through the interlayer insulator 104. For grounding, a part of the patterned wires of the second wiring layer 105 are connected to the island 101a through contacts 110 (only one shown). Each contact 110 is provided within a through-hole penetrating through the interlayer insulator 104 and the lower insulator 102.

The IC chip 106 is connected to a part of the patterned wires or the electrode pads of the second wiring layer 105 through wires 109a. The single chip 107, such as a resistor, a capacitor, etc., is directly connected to a part of the patterned wires or the electrode pads of the second wiring layer 105. The remaining electronic components are similarly connected to the patterned wires or the electrode pads.

Part of the patterned wires (or electrode pads) 103a and 105a of the first wiring layer 103 and the second wiring layer 105 are connected to leads 101b of the lead frame 101 through respective wires 109b.

A top side of the MCM is covered with a molding resin and thereby the electronic components and wires 109a are embed in the resin.

Such an MCM is disclosed in Japanese Patent No. 3171172.

In the MCM illustrated in FIGS. 1A and 1B, the IC chip 106 and the single chip 107 as a source of electromagnetic waves are simply covered with the molding resin. Since the molding resin has no electromagnetic shield capability, almost entire electromagnetic waves generated by the IC chip 106 and the single chip 107 is radiated in the vicinity of the MCM.

Furthermore, the MCM has a poor heat dissipation performance because the molding resin blocks the radiation of heat generated by the IC chip 106 and the single chip 107.

Figure 2:
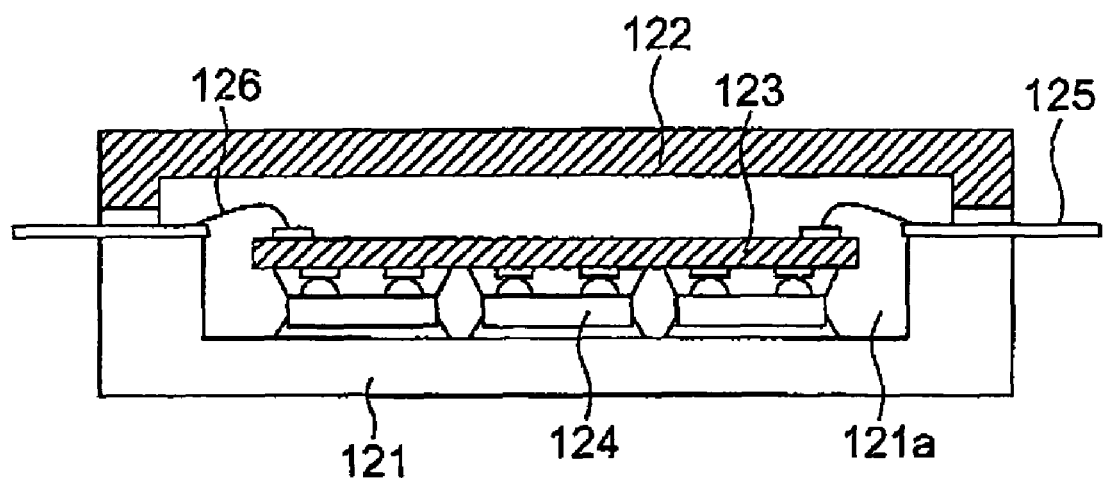
FIG. 2 is a longitudinal sectional view of another known MCM.

Next, referring to FIG. 2, another related MCM 120 will be mentioned below. FIG. 2 is a longitudinal sectional view of the MCM 120.

The MCM 120 comprises a metal plate 121 having a recess 121a on the top surface thereof, a ceramic lid 122 covering the recess 121a, a dielectric substrate 123 with electrode pads, semiconductor chips 124 flipchip bonded to the recess 121a and electrically connected to part of the electrode pads on the dielectric substrate 123, package terminals 125 extending from inside the recess 121a to outside the metal plate 121, and bonding wires 126 for connecting part of the electrode pads on the dielectric substrate 123 to the package terminals 125.

Such an MCM is disclosed in Japanese Unexamined Patent Publication No. 2001-274278.

In the MCM illustrated in FIG. 2, the bottom side of the semiconductor chips 124 are covered with the metal plate 121, but the top side of the semiconductor chips 124 are merely covered with the ceramic lid 122. The electromagnetic waves generated by the semiconductor chips 124 is radiated upward without any shielding.

As mentioned above, the related MCMs shown in FIGS. 1A–1B and 2 can not prevent electromagnetic waves from radiating outside.

Proposals have been made about an electronic device and a method for manufacturing the electronic device for solving above-mentioned problems. The present invention finds appropriate applications for use in a smaller scale device than the above-mentioned proposed electronic device. Furthermore, the electronic device of this invention enjoys a smaller component count, a simplified manufacturing process, and reduced manufacturing costs.

Referring to FIGS. 3 to 6, the description is directed to an electronic device (or a semiconductor device) according to a first embodiment of this invention.

Figure 3:
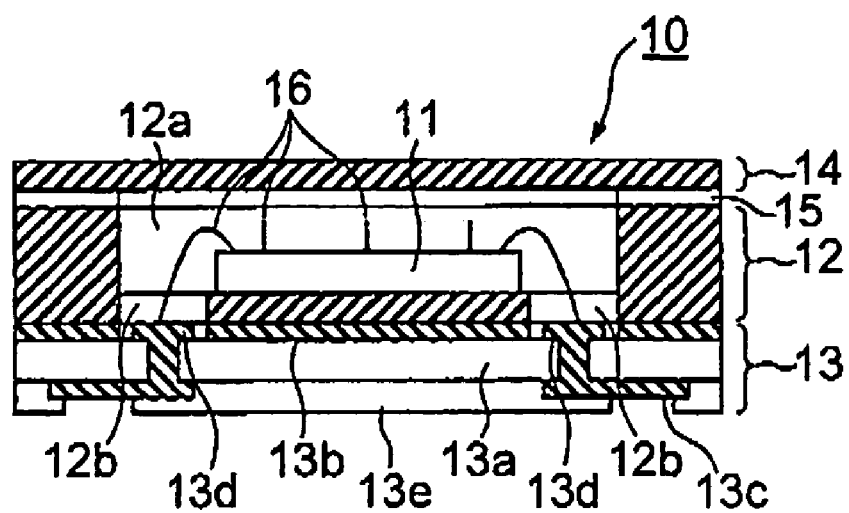
FIG. 3 is a longitudinal sectional view of a semiconductor device according to a first embodiment of the present invention.

FIG. 3 is a longitudinal sectional view of the electronic device 10. In FIG. 3, the semiconductor device 10 comprises an electronic component 11 such an IC chip, a metal substrate 12 having a recess (or a blind hole) 12a for housing the electronic component 11, a wiring board 13 fixed to the underside (the bottom surface) of the metal substrate 12, and a metal lid 14 fixed to the upper surface (top surface) of the metal substrate 12.

The metal substrate 12 is a lead frame, for example, and is made of copper or an alloy of copper. The recess 12a has an opening opened upward, and has a size large enough to fully receive or accommodate the electronic component 11. The depth of the recess 12a, sufficiently larger than the thickness of the electronic component 11, is 200 µm or larger, for example. The metal substrate 12 has windows 12b that are opened from the bottom of the recess 12a through to the bottom surface of the metal substrate 12. The underside of the metal substrate 12 is coated with gold, tin, silver, or a combination thereof taking into consideration bonding with the wiring board 13. The top surface of the metal substrate 12 is coated with gold, tin, silver or a combination thereof taking into consideration bonding with the metal lid 14.

The wiring board 13 is a tape automated bonding (TAB) tape, and includes a base 13a, such as a polyimide tape, and wiring patterns 13b and 13c respectively formed on the top and bottom surfaces of the base 13a. The wiring pattern 13b on the top surface of the base 13a comprises electrode pads 13d to be connected to the electronic component 11 and a ground electrode. In other words, a part of the wiring pattern 13b serve as the electrode pads 13d, and the remaining part is used as the ground electrode. The ground electrode covers the entire top surface of the base 13a except the electrode pads 13d and the area surrounding the electrode pads 13d. The electrode pads 13d to be connected to the electronic component 11 are electrically connected to a part of the wiring pattern 13c. Specifically, the wiring pattern 13c comprises electrode pads corresponding to the electrode pads 13d. The electrode pads of the wiring pattern 13c are connected to the electrode pads 13d through contacts that penetrate the base 13a. The top surface of the wiring pattern 13b is coated with gold, tin, silver, or a combination thereof taking into consideration bonding with the metal substrate 12. The bottom surface of the wiring board 13, except a portion (corresponding to the electrode pads) of the wiring pattern 13c, is entirely covered with a solder resist layer 13e. As shown in FIG. 3, the area of the top surface of the wiring board 13 (the surface facing the metal substrate 12) is larger than the area of the opening of the recess 12a of the metal substrate 12.

The material of the metal lid 14 is the same as or different from the material of the metal substrate 12. The surface of the metal lid 14 is coated with gold, tin, nickel, or a combination thereof taking into consideration bonding with the metal substrate 12. When the metal lid 14 is bonded to the metal substrate 12, the surface coating (surface treatment coating) becomes a metal bonding layer 15 between the metal lid 14 and the metal substrate 12.

The electronic component 11 is fully accommodated in the recess 12a of the metal substrate 12. The electronic component 11 is metal bonded to the bottom of the recess 12a by fusing a gold or tin strip. Input and output terminals of the electronic component 11 are connected to the electrode pads 13d exposed in the windows 12b using bonding wires 16.

Figure 4:
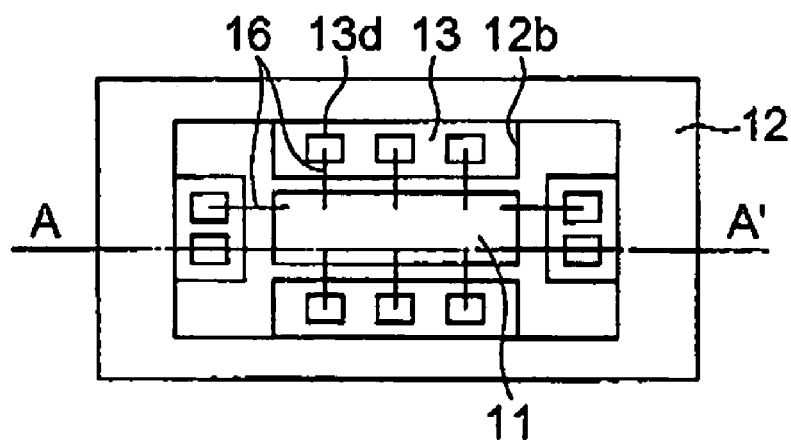
FIG. 4 is a plan view of the semiconductor device of FIG. 3 in the state thereof prior to the mounting of a metal lid thereto.

FIG. 4 is a plan view of the semiconductor device 10 with the metal lid 14 thereof removed. FIG. 3 is the sectional view taken along line A–A' in FIG. 4.

A method for manufacturing the semiconductor device 10 of FIG. 3 is now described with reference to FIGS. 5A–5F and FIGS. 6A–6E. FIGS. 5A–5F are sectional views illustrating each step of the manufacturing process of the semiconductor device 10, and FIGS. 6A–6E are plan views illustrating each step of the manufacturing process of the semiconductor device 10. Steps illustrated in FIGS. 5A–5E respectively correspond to steps illustrated in FIGS. 6A–6E.

Figure 5A:
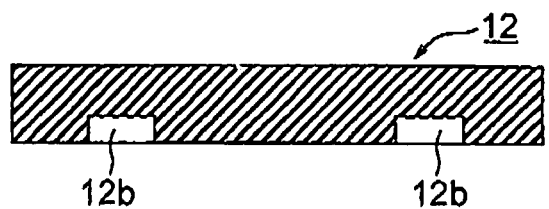
FIGS. 5A–5F illustrate a manufacturing process for manufacturing the semiconductor device of FIG. 1.
Figure 6A:
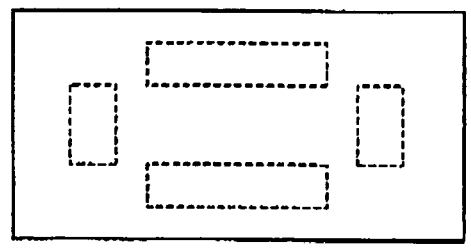
FIGS. 6A–6E are plan views of the manufacturing process for manufacturing the semiconductor of FIG. 1, respectively corresponding to FIGS. 5A–5E.

As illustrated in FIG. 5A and FIG. 6A, a plurality of blind holes are formed as the windows 12b in the metal substrate 12 by half etching the metal substrate 12. FIG. 6A shows the top surface of the metal substrate 12, and the holes (half-etched portions) formed on the bottom surface of the metal substrate 12 do not appear and be represented by broken lines.

Figure 5B:
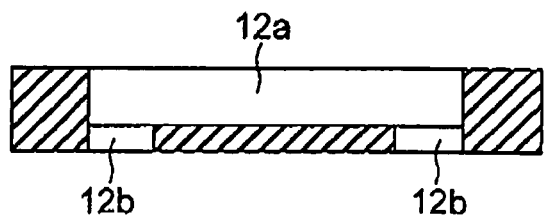
Figure 6B:
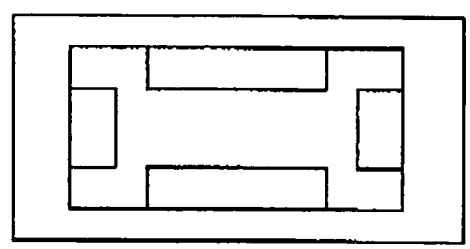

Referring to FIG. 5B and FIG. 6B, the top surface of the metal substrate 12 is subjected to a half-etching operation, and the recess 12a is formed. Through this step, the blind holes formed on the bottom surface of the metal substrate 12 become through-holes as the windows 12b.

Figure 5C:
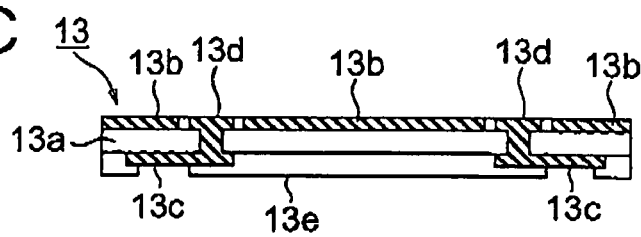
Figure 6C:
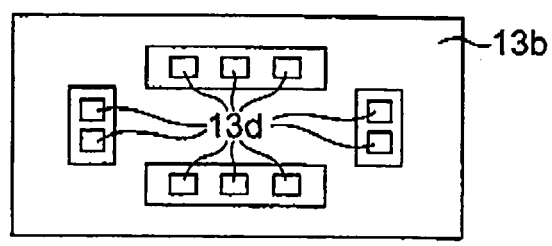

In a separate step, the wiring board 13 is produced as shown in FIG. 5C and FIG. 6C.

Figure 5D:
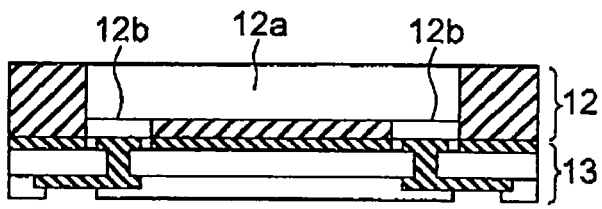
Figure 6D:
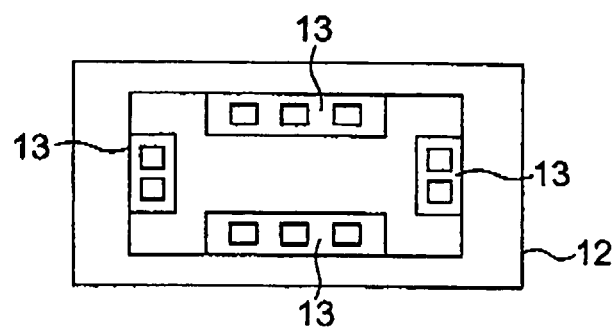

As shown in FIG. 5D and FIG. 6D, the wiring board 13 is bonded and thus fixed to the underside of the metal substrate 12 which has the metal recess 12a and the windows 12b. This process is performed as follows.

The surface of the wiring pattern disposed on the top surface of the wiring board 13 is coated with a surface treatment film of gold (the film may contain a nickel layer as an underlayer). If the bottom surface of the metal substrate 12 is then coated with a surface treatment film made of silver, the metal substrate 12 and the wiring board 13 are pressed into contact under predetermined high-temperature and high-pressure conditions. Thus, silver-gold diffusion bonding is performed. A resulting silver-gold diffusion bonded layer (not shown) achieves both electrical connection and mechanical connection, required for the semiconductor device 10.

If the top surface of the wiring pattern of the wiring board 13 is coated with a surface treatment film made of gold (the film may contain a nickel layer as an underlayer), and the bottom surface of the metal substrate 12 is coated with a surface treatment film made of tin, a gold-tin fusion bond is achieved by pressing the bottom surface of the metal substrate 12 and the top surface of the wiring board 13 into contact under predetermined high-temperature conditions. The resulting gold-tin fusion bonded layer (not shown) also satisfies electrical connection and mechanical connection, required for the semiconductor device 10.

Both the surface treatment film on the bottom surface of the metal substrate 12 and the surface treatment film on the wiring pattern of the wiring board 13 may be made of tin. In this case, fusion bonding satisfying both electrical connection and mechanical connection, required for the semiconductor device 10, is achieved by setting up appropriate temperature conditions.

Figure 5E:
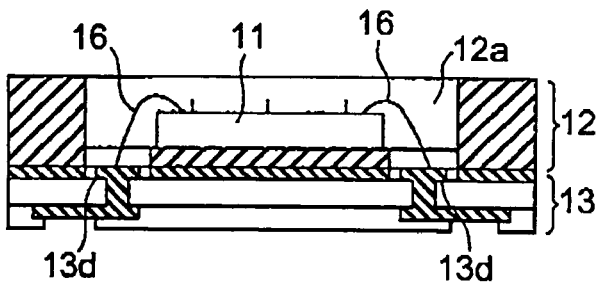
Figure 6E:
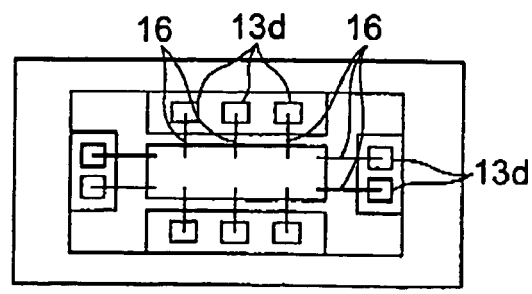

As shown in FIG. 5E and FIG. 6E, the electronic component 11 is placed and fixed on the bottom of the recess 12a by metal bonding using a gold-tin strip or the like. The input and output terminals of the electronic component 11 are respectively connected to the electrode pads 13d of the wiring board 13 using the bonding wires 16.

Figure 5F:
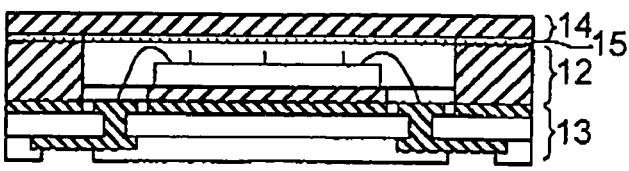

As shown in FIG. 5F, the metal lid 14 is bonded to the top surface of the metal substrate 12. In the course of bonding, a metal bonding layer (a diffusion bonding layer or a fusion bonding layer) 15 is created between the metal substrate 12 and the metal lid 14.

The semiconductor device 10 shown in FIG. 1 is thus manufactured.

The semiconductor device 10 of the first embodiment of the present invention has the following advantages.

First, the electromagnetic wave emitted by the electronic component 11 is almost completely confined in the semiconductor device 10. In other words, the electronic component 11 prevents the electromagnetic waves emitted therefrom from being radiated in the surrounding environment. This is because the electronic component 11 is surrounded by the metal substrate 12, the metal lid 14 and the ground electrode (or the wiring pattern 13b disposed on the wiring board 13).

Second, heat generated by the electronic component 11 is efficiently dissipated because the electronic component 11 is metal bonded to the bottom of the recess 12a. More specifically, heat generated within the electronic component 11 is transferred to the metal substrate 12 having a large volume through the metal bonded portion between the electronic component 11 and the metal substrate 12. The heat is then dissipated to a circuit board having the semiconductor device 10 mounted thereon and/or to the environment.

Third, the semiconductor device enjoys a smaller component count, is easy to manufacture, and provides a high manufacturing yield. This is because only a single wiring board is used. The connection between elements is performed on a one-to-one correspondence basis, and there is no need for concurrently connecting three or more elements. There is no need for connecting two wiring boards. Furthermore, the use of the single wiring board reduces the manufacturing costs because it simplifies the structure and the manufacturing process of the electronic device.

Fourth, low manufacturing costs, and high productivity are achieved because a flipchip bonder having a long turn around time (TAT), which is expense, is not used in the connection of the electronic component 11 to the wiring board. If one company manufactures the metal substrate and the wiring board and another company manufactures the electronic component, the elements are circulated in one way. More specifically, the precision level required in the bonding of the metal lid 14 to the metal substrate 12 is lower than the precision level required in the bonding of the metal substrate 12 to the wiring board 13. The company of the electronic component can mount not only the electronic component, but also the metal lid. After receiving the metal substrate and the wiring board, the company of the electronic component can manufacture the electronic device in-house.

Figure 7:
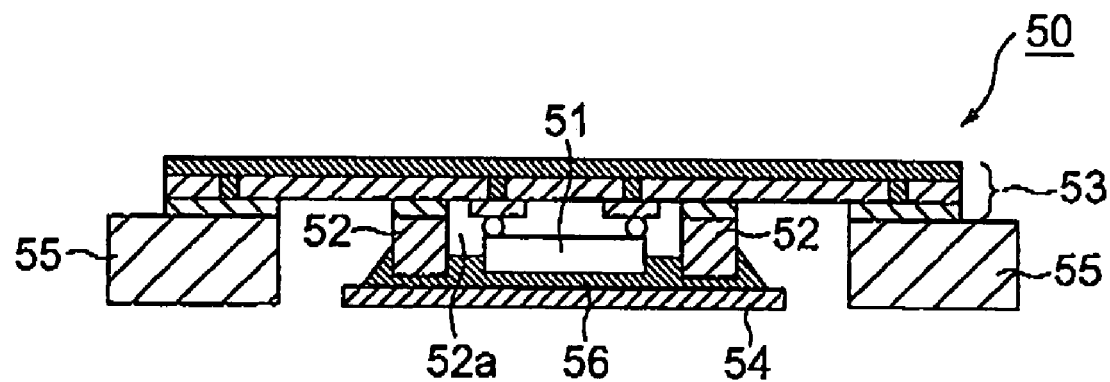
FIG. 7 is a longitudinal sectional view of a semiconductor device according to a second embodiment of the present invention.

Referring to FIG. 7, the description will be directed to a semiconductor device 50 according to a second embodiment of the present invention.

FIG. 7 is a longitudinal sectional view of the semiconductor device 50. The semiconductor device 50 comprises an electronic component 51, a main metal substrate 52 having a through-hole 52a to receive the electronic component 51, a wiring board 53 fixed on the surface of the main metal substrate 52, and a metal lid 54 fixed to the underside of the main metal substrate 52. The semiconductor device 50 also includes a plurality of leads 55 made of the same material as that of main metal substrate 52.

The difference of the semiconductor device 50 from the semiconductor device 10 of the first embodiment of the present invention is that the electronic component 51 is flipchip bonded to printed wires of the wiring board 53. This difference between the semiconductor device 50 of the second embodiment and the semiconductor device 10 of the first embodiment causes the following differences therebetween.

The main metal substrate 52 has the through-hole 52a rather than the recess. One opening of the through-hole 52a is closed by the wiring board 53 and the other opening of the through-hole 52a is closed by the metal lid 54. A combination of the main metal substrate 52 and the metal lid 54 constitutes a metal substrate having a recess for receiving the electronic component 51. The thickness of the main metal substrate 52 is determined so that an overall thickness of the main metal substrate 52 and the metal lid 54, when bonded together, equals the thickness of the lead 55. For example, the thickness of the main metal substrate 52 is 0.3 to 0.8 times the thickness of the lead 55.

The wiring board 53 has flipchip bonding terminals. The surface of each flipchip bonding terminal is coated with gold, tin, or both.

The electronic component 51 is flipchip bonded to the wiring board 53. The electronic component 51 and the wiring board 53 form a hollow structure that spacing is left between the top surface of the electronic component 51 and the wiring board 53. The underside of the electronic component 51 is coated with gold or tin taking into consideration bonding with the metal lid 54.

In the manufacturing process of the semiconductor device 50, the electronic component 51 is bonded to the wiring board 53 after the main metal substrate 52 (and the lead 55) is bonded to the wiring board 53 in the same manner as in the semiconductor device 10 of the first embodiment of the present invention. Subsequently, the metal lid 54 is bonded to the main metal substrate 52. The metal lid 54 is bonded to the electronic component 51 (for example, in gold-tin eutectic bonding) when the metal lid 54 is bonded to the main metal substrate 52. In this way, a eutectic bonding layer 56 is formed between the metal lid 54 and each of the electronic component 51 and the main metal substrate 52. The metal lid 54 thus bonded to the electronic component 51 functions as a ground plate and a heat sink.

The semiconductor device 50 of the second embodiment of the present invention provides substantially the same advantages as the semiconductor device 10 of the first embodiment, except the advantage resulting from the use of the wire bonding.

In comparison with the semiconductor device 10 of the first embodiment, the semiconductor device 50 implements a thin design, and has a short wiring length. This is because the flipchip bonding, rather than the bonding wire, is used for the electrical connection between the electronic component 51 and the wiring board 53.

Figure 8:
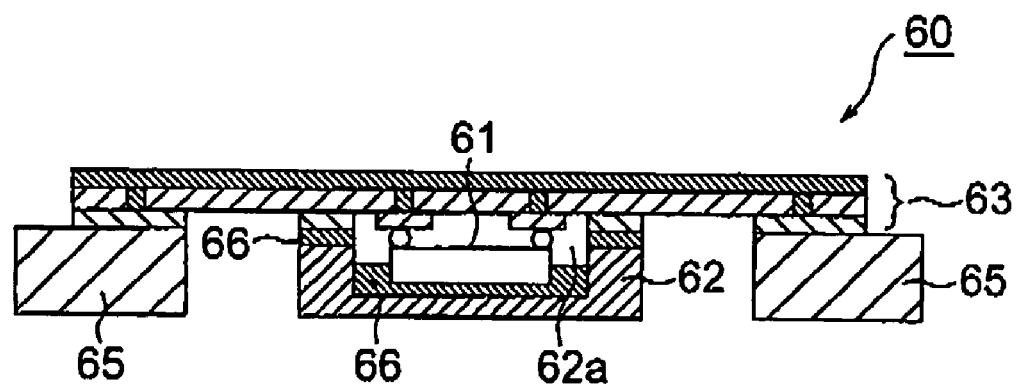
FIG. 8 is a longitudinal sectional view of a semiconductor device according to a third embodiment of the present invention.

Referring to FIG. 8, the description will be made about a semiconductor device 60 according to third embodiment of the present invention.

FIG. 8 is a longitudinal sectional view of the semiconductor device 60. The semiconductor device 60 comprises an electronic component 61, a metal substrate 62 having a recess 62a to receive the electronic component 61, a wiring board 63 fixed to the top surface of the metal substrate 62, and a plurality of leads 65 made of the same material as metal substrate 62.

The difference between the semiconductor device 60 and the semiconductor device 50 of the second embodiment is that the metal substrate 62 has no through-hole and requires no metal lid.

The semiconductor device 60 is manufactured by bonding the metal substrate 62 to the wiring board 63 after the electronic component 61 is flipchip bonded to the printed wires of the wiring board 63. The electronic component 61 is received in the recess 62a of the metal substrate 62 and is bonded to the bottom of the recess 62a. The underside of the electronic component 61 is coated beforehand with gold or tin to be bonded to the metal substrate 62. The electronic component 61 is bonded and fixed to the bottom of the recess 62a of the metal substrate 62 using gold-tin eutectic bonding. A metal bonding layer 66 is formed between the metal substrate 62 and each of the electronic component 61 and the wiring board 63. The metal substrate 62 thus bonded to the electronic component 61 functions as a ground electrode and a heat sink.

The semiconductor device 60 of the third embodiment provides substantially the same advantages as the semiconductor device 50 of the second embodiment of the present invention.

The semiconductor device 60 of the third embodiment is smaller in component count than the semiconductor device 50 of the second embodiment of the present invention. This is because the semiconductor device 60 requires no metal lid.

The semiconductor device 60 also has an advantage that electrical tests are performed prior to the completion of the manufacture thereof. This is because the electronic component 61 is fixed (or electrically connected) to the wiring board 63 before the wiring board 63 is fixed to the metal substrate 62.

While this invention has thus far been described in conjunction with the few embodiments thereof, it will readily be possible for those skilled in the art to put this invention into practice in various other manners.

In the semiconductor devices of the above-mentioned embodiments, a single electronic component only is housed in the recess of the metal substrate. Alternatively, two or more electronic components may be housed in the recess of the metal substrate.

The above-mentioned embodiments use the diffusion bonding or the fusion boding in the bonding of the wiring board to the metal substrate and the metal lid to the metal substrate (or the main metal substrate). Another metal press bonding technique or another mechanical bonding technique may be used as long as such a technique achieves both electrical connection and mechanical connection. In such a case, a surface treatment film made of a material other than those described above may be used.

In accordance with the second and third embodiments, the flipchip bonding is used to electrically connect the electronic component to the wiring board. Alternatively, the wire bonding may be used instead.

In accordance with the second and third preferred embodiments, the electronic component is bonded to the metal substrate to achieve heat dissipation and grounding. The electronic component may be a surface-acoustic wave (SAW) filter that requires no particular heat sink means and includes a ground terminal on a wiring board. Such an electronic component does not need to be bonded to the metal substrate.

What is claimed is:

1. An electronic device comprising:
   an electronic component;
   a metal substrate having a recess which is large enough to fully receive the electronic component and which is defined by a metal outer frame and a metal bottom plate; and
   a wiring board having a surface area larger than the area of the opening of the recess and having a wiring pattern formed on the top surface thereof,
   at least a portion of the surface of the wiring board being fixed to the bottom surface of the metal substrate, and
   the electronic component being mechanically fixed to the bottom of the recess while being electrically connected to the wiring pattern,
   wherein the metal substrate comprises a window that is opened from the bottom of the recess through to the bottom surface thereof, wherein the wiring board is fixed to the bottom surface of the metal substrate so that a portion of the wiring pattern is exposed in the recess through the window, and wherein the electronic component is electrically connected to the wiring pattern exposed in the recess through the window using a bonding wire.

2. An electronic device as claimed in claim 1, wherein the wiring board comprises another wiring pattern on the bottom surface thereof, and wherein the wiring pattern on the top surface of the wiring board is electrically connected to the wiring pattern on the bottom surface of the wiring board via a contact formed through the wiring board.

3. An electronic device as claimed in claim 1, further comprising a metal lid fixed to close the opening of the recess.

4. An electronic device as claimed in claim 1, wherein the wiring board is fixed to the top surface of the metal substrate in a manner such that the wiring board closes the opening of the recess, and wherein the electronic component is connected to the wiring pattern using flipchip bonding.

5. An electronic device as claimed in claim 1, wherein the wiring board is fixed to the metal substrate using one of diffusion bonding and fusion boding, in which a surface treatment film made of gold, silver, tin, or a combination thereof is formed on each of a surface area of the wiring pattern and a surface area of the metal substrate to be bonded together and the surface treatment film of the wiring pattern and the surface treatment film of the metal substrate are forced into contact under a predetermined condition.

6. An electronic device as claimed in claim 1, wherein the full bottom surface of said electronic component is in contact to define said recess.

7. An electronic device as claimed in claim 1, wherein said metal substrate has a metal plate attached to said electronic component.

8. An electronic device as claimed in claim 4, wherein the metal substrate comprises a main substrate portion having a through hole that is opened from the top surface to the bottom surface, and a metal lid that closes the opening of the through hole on one side of the through hole to produce the recess from the through hole.

9. An electronic device as claimed in claim 7, wherein said metal plate fully covers the bottom surface of said electronic component.

10. An electronic device as claimed in claim 7, wherein said metal plate is wider than said electronic component.

* * * * *